United States Patent
Fompeyrine et al.

(10) Patent No.: US 9,805,949 B2
(45) Date of Patent: Oct. 31, 2017

(54) HIGH κ GATE STACK ON III-V COMPOUND SEMICONDUCTORS

(75) Inventors: Jean Fompeyrine, Rueschlikon (CH); Edward W. Kiewra, Verbank, NY (US); Steven J. Koester, Ossining, NY (US); Devendra K. Sadana, Pleasentville, NY (US); David J. Webb, Rueschlikon (CH)

(73) Assignee: GLOBALFOUNDRIES INC., Grand Cayman (KY)

( * ) Notice: Subject to any disclaimer, the term of this patent is extended or adjusted under 35 U.S.C. 154(b) by 461 days.

(21) Appl. No.: 13/607,741

(22) Filed: Sep. 9, 2012

(65) Prior Publication Data
US 2012/0326212 A1 Dec. 27, 2012

Related U.S. Application Data

(62) Division of application No. 11/327,675, filed on Jan. 6, 2006, now abandoned.

(51) Int. Cl.
*H01L 21/02* (2006.01)
*H01L 21/316* (2006.01)
(Continued)

(52) U.S. Cl.
CPC .. *H01L 21/31645* (2013.01); *H01L 21/28158* (2013.01); *H01L 21/3145* (2013.01);
(Continued)

(58) Field of Classification Search
CPC ......... H01L 2924/0002; H01L 2924/00; H01L 21/28158; H01L 21/3145; H01L 21/31645; H01L 29/513; H01L 29/518; H01L 29/78
See application file for complete search history.

(56) References Cited

U.S. PATENT DOCUMENTS 6,255,004 B1    7/2001  Yoshida
6,444,592 B1    9/2002  Ballantine et al.
(Continued)

OTHER PUBLICATIONS

D. Park, et al., "Metal-Insulator-Semiconductor Structure on GaAs Using a Pseduomorphic si/GaP interlayer", J. Vac. Sci. Technol. B 15(2), Mar./Apr. 1997, pp. 252-258.*
(Continued)

*Primary Examiner* — Meiya Li
(74) *Attorney, Agent, or Firm* — Scully Scott Murphy and Presser; Frank DiGiglio (57) ABSTRACT

A method of forming a high k gate stack on a surface of a III-V compound semiconductor, such GaAs, is provided. The method includes subjecting a III-V compound semiconductor material to a precleaning process which removes native oxides from a surface of the III-V compound semiconductor material; forming a semiconductor, e.g., amorphous Si, layer in-situ on the cleaned surface of the III-V compound semiconductor material; and forming a dielectric material having a dielectric constant that is greater than silicon dioxide on the semiconducting layer. In some embodiments, the semiconducting layer is partially or completely converted into a layer including at least a surface layer that is comprised of $AO_xN_y$ prior to forming the dielectric material. In accordance with the present invention, A is a semiconducting material, preferably Si, x is 0 to 1, y is 0 to 1 and x and y are both not zero.

6 Claims, 3 Drawing Sheets

(51) Int. Cl.
*H01L 21/28* (2006.01)
*H01L 21/314* (2006.01)
*H01L 29/51* (2006.01)
*H01L 29/78* (2006.01)

(52) U.S. Cl.
CPC .......... *H01L 29/513* (2013.01); *H01L 29/518* (2013.01); *H01L 29/78* (2013.01); *H01L 2924/0002* (2013.01)

(56) References Cited

U.S. PATENT DOCUMENTS

| | | | |
|---|---|---|---|
| 6,573,197 B2* | 6/2003 | Callegari et al. | 438/791 |
| 6,664,186 B1 | 12/2003 | Callegari et al. | |
| 6,727,134 B1 | 4/2004 | Chen et al. | |
| 2002/0151142 A1* | 10/2002 | Callegari | C23C 16/24 438/287 |
| 2003/0027392 A1 | 2/2003 | Gousev et al. | |
| 2003/0091083 A1 | 5/2003 | Hwang et al. | |
| 2004/0099886 A1 | 5/2004 | Rhodes et al. | |
| 2004/0126947 A1* | 7/2004 | Sohn | H01L 21/26513 438/197 |
| 2005/0224800 A1 | 10/2005 | Lindert et al. | |
| 2006/0001071 A1 | 1/2006 | Brask et al. | |
| 2006/0022283 A1 | 2/2006 | Thomas et al. | |
| 2006/0151787 A1 | 7/2006 | Chen et al. | |
| 2006/0189110 A1 | 8/2006 | Mandelman et al. | |
| 2007/0148838 A1 | 6/2007 | Doris et al. | |
| 2007/0152276 A1 | 7/2007 | Arnold et al. | |

OTHER PUBLICATIONS

H. Hasegawa, "MBE growth and applications of silicon interface control layers", Thin Solid Films 367, 2000, p. 58-67.*

R. J. Soukup et al., "Circuit modeling of GaAs: a-SiC interfaces", J. Vac. Sci. Technol. A7(3), May/Jun. 1989, p. 753-757.*

Office Action dated Feb. 4, 2014 received in related U.S. Patent Application, namely U.S. Appl. No. 11/327,675.

Passlack et al. "Low Dit, Thermodynamically Stable Ga2O3—GaAs Interfaces: Fabrication, Characterization, and Modeling", IEEE Transactions on Electron Devices, vol. 44, No. 2, p. 214, Feb. 1997.

M. Hong et al., "Low Interface State Density Oxide-GaAs Structures Fabricated by in situ Molecular Beam Epitaxy", J. Vac. Sci., Technol. B 14(3), p. 2297, May/Jun. 1996.

Tiwari et al. "Unpinned GaAs MOS Capacitors and Transistors", IEEE Electron Device Letters, vol. 9, No. 9, p. 488, Sep. 1988.

D. S. L. Mui et al, "Si3N4/Si/In0.53Ga0.47As Depletion-mode Metal-Insulator-Semiconductor Field Effect Transistors With Improved Stability", Appl. Phys. Lett., 62 (25), p. 3291, Jun. 21, 1993.

Z. Wang et al., "Si3N4/Si/n—GaAs Capacitor with Minimum Interface Density in the 1010 eV-1 cm-2 Range", Appl. Phys. Lett., 62 (23), p. 2977, Jun. 7, 1993.

Z. Wang et al., "Gate Quality Si3N4/Si/n—In0.53Ga0.47As Metal-Insulator-Semiconductor Capacitors", Appl. Phys. Lett., 61 (15) p. 1826, Oct. 12, 1992.

D.S.L. Mui et al. "Investigations of the Si3N4/Si/n—GaAs Insulator-Semiconductor Interface With Low Interface Trap Density", Appl. Phys. Lett., 60 (20), p. 2511, May 18, 1992.

D.S.L. Mui et al. "Electrical Characteristics of Si3N4/Si/GaAs Metal-Insulator-Semiconductor Capacitor", Appl. Phys. Lett. 59 (22), p. 2847, Nov. 25, 1991.

Callegari et al., "Properties of SiO2/Si/GaAs Structures Formed by Solid Phase Epitaxy of amorphous Si on GaAs", App. Phys. Lett. 58, (22), p. 2540, Jun. 3, 1991.

* cited by examiner

HIGH κ GATE STACK ON III-V COMPOUND SEMICONDUCTORS

CROSS REFERENCE TO RELATED APPLICATION

This application is a divisional of U.S. patent application Ser. No. 11/327,675, filed Jan. 6, 2006 the entire content and disclosure of which is incorporated herein by reference.

DESCRIPTION

Field of the Invention

The present invention relates to a semiconductor structure, and more particularly to a semiconductor structure including a dielectric material having a dielectric constant of greater than that of silicon dioxide located on a passivated surface of a III-V compound semiconductor in which the passivated surface has electrical properties that are sufficient for high-performance field effect transistor (FET) applications. The present invention also provides a method of fabricating such a semiconductor structure.

Background of the Invention

In semiconductor technology, an elemental semiconductor material such as, for example, Si or Ge, is typically used as a substrate in which one or more semiconductor devices including, but not limited to, FETs and capacitors, are formed. Of the various elemental semiconductor materials, Si is the elemental semiconductor of choice due to process and performance benefits that are achieved using such an elemental semiconductor material.

Alternative semiconductor materials such as, for example, compound semiconductors, are also known which are used for specific market applications. A major class of compound semiconductors are comprised of at least one element from Group IIIA and Group VA of the Periodic Table of Elements. Such compound semiconductors including an element from Group IIIA and VA are often referred to as III-V or III/V compound semiconductors. Illustrative examples of III-V compound semiconductors include, but are not limited to: GaAs, InP, InAs, GaP, InSb, GaSb and GaN.

The need for alternative semiconductor materials is driven by the growth of markets that require integrated circuit (IC) performance beyond that which Si semiconductors can provide. One key IC performance factor that needs to be achieved is high operating speeds. Wireless and high-speed digital communications, space applications, and consumer markets are developing special niche semiconductor markets that are centered on high speed that can support higher signal frequencies.

GaAs, which is the most common III-V compound semiconductor material, has greater electron mobility than Si so the majority carriers move faster than in Si. There are also some attributes of a GaAs semiconductor material that reduce parasitic capacitance and signal losses. These result in ICs that are generally faster than those made with silicon. The improved signal speed of GaAs devices permits them to react to high-frequency microwave signals and accurately converts them into electrical signals. As such, products for wireless and high-speed digital communications and high-speed optoelectronic devices are made from GaAs and other III-V compound semiconductors.

One major disadvantage of a GaAs compound semiconductor material (as well as the other III-V compound semiconductors) is the lack of a natural oxide. This feature hinders the development of standard metal oxide semiconductor (MOS) devices that require the ability to form a surface dielectric.

Moreover, when a dielectric material having a dielectric constant that is greater than silicon dioxide (k greater than 4.0) is deposited on a GaAs semiconductor material that has an unpassivated surface, the interface between the high k dielectric and the GaAs semiconductor material is typically poor, resulting in a high interface state density (on the order of about $10^{13}$ cm$^{-2}$ eV$^{-1}$ or greater). Because of such a high interface state density, the electrical properties of the dielectric are insufficient for use with high-performance FETs.

Several known solutions have been proposed, but each have problems/drawbacks associated therewith. One such solution is disclosed, for example by Passlack et al. "Low $D_{it}$, Thermodynamically Stable Ga$_2$O$_3$—GaAs Interfaces: Fabrication, Characterization, and Modeling", IEEE Transactions on Electron Devices, Vol 44, No. 2, p. 214, February 1997 and by M. Hong et al., "Low Interface State Density Oxide-GaAs Structures Fabricated by in situ Molecular Beam Epitaxy", J. Vac. Sci., Technol. B 14 (3), p. 2297, May/June 1996. The prior art technique described in the two aforementioned disclosures involves deposition of a Ga$_2$O$_3$/Gd$_2$O$_5$ oxide on a clean/reconstructed GaAs surface in an ultra-high vacuum using an ultra-low oxygen ambient. This prior art technique has been shown to be successful in unpinning the GaAs/oxide interface, and produces a very low density of interface states. However, it requires a complex dual chamber molecular beam epitaxial (MBE) system which is not suitable for manufacturing. Moreover, Ga$_2$O$_3$ has the problem that it has a relatively low bandgap, and therefore can produce higher leakage than is desirable for scaled MOSFET applications.

Another solution to the general problem mentioned above is disclosed, for example, in Tiwari et al. "Unpinned GaAs MOS Capacitors and Transistors", IEEE Electron Device Letters, Vol. 9, No. 9, p. 488, September 1988; D. S. L. Mui et al, "Si$_3$N$_4$/Si/In$_{0.53}$Ga$_{0.47}$As Depletion-mode Metal-Insulator-Semiconductor Field Effect Transistors With Improved Stability", Appl. Phys. Lett., 62 (25), p. 3291, Jun. 21, 1993; Z. Wang et al., "Si$_3$N$_4$/Si/n-GaAs Capacitor with Minimum Interface Density in the $10^{10}$ eV$^{-1}$ cm$^{-2}$ Range", Appl. Phys. Lett., 62 (23), p. 2977, Jun. 7, 1993; Z. Wang et al., "Gate Quality Si$_3$N$_4$/Si/n-In$_{0.53}$Ga$_{0.47}$As Metal-Insulator-Semiconductor Capacitors", Appl. Phys. Lett., 61 (15) p. 1826, Oct. 12, 1992; D. S. L. Mui et al. "Investigations of the Si$_3$N$_4$/Si/n-GaAs Insulator-Semiconductor Interface With Low Interface Trap Density", Appl. Phys. Lett., 60 (20), p. 2511, May 18, 1992; and D. S. L. Mui et al. "Electrical Characteristics of Si$_3$N$_4$/Si/GaAs Metal-Insulator-Semiconductor Capacitor", Appl. Phys. Lett. 59 (22), p. 2847, Nov. 25, 1991. Specifically, each of the aforesaid articles disclose the deposition of a thin Si layer on top of a GaAs substrate in a MBE chamber after GaAs growth. In some of these disclosures, the Si is deposited in the same chamber as the GaAs using a heated elemental Si source. In other disclosures, a second dual chamber system is employed, and the interfacial Si is deposited using an ECR source, which allows higher deposition rates. Both of these techniques mentioned in the above articles have the problem that an III-V MBE chamber is needed to first produce a high-quality GaAs interface before Si deposition.

Callegari et al., "Properties of SiO$_2$/Si/GaAs Structures Formed By Solid Phase Epitaxy of amorphous Si on GaAs", App. Phys. Lett. 58, (22), p. 2540, Jun. 3, 1991 provide a method wherein the GaAs compound semiconductor is subjected to a H-precleaning process prior to deposition, e.g., plasma enhanced chemical vapor deposition (PECVD) of a Si layer. After deposition of the Si layer, SiO$_2$ is formed on the precleaned GaAs surface.

In addition to the above-mentioned techniques, several techniques have been purposed to passivate a GaAs surface, yet these techniques have not been utilized in conjunction with a high k dielectric. These prior art GaAs passivation techniques include, for example, nitrogen passivation and sulfur passivation. Both of the aforementioned passivation techniques have been shown to unpin the GaAs surface under certain conditions, but it is not clear whether or not such passivation techniques would work in conjunction with a high k dielectric.

In view of the above, there is a need for providing a method in which a high k dielectric stack can be formed on a surface of a III-V compound semiconductor material with electrical properties sufficient for high-performance FET applications. That is, a method is needed in which the interface between the high k dielectric stack and the III-V compound semiconductor material is of good quality, resulting in low interface state density (on the order of about $10^{12}$ $cm^{-2}$ $eV^{-1}$ or less). More specifically, a structure including an unpinned III-V compound semiconductor surface is needed.

SUMMARY OF THE INVENTION

The present invention provides a method in which a high k dielectric material having a dielectric constant of greater than that of silicon dioxide can be formed on a surface of a III-V compound semiconductor material with electrical properties sufficient for high-performance FET applications wherein the interface between the high k dielectric material and the III-V compound semiconductor material is of good quality, resulting in a low interface state density (on the order of about $10^{12}$ $cm^{-2}$ $eV^{-1}$ or less); the unit for the interface state density can also be written as $cm^{-2}/eV$. That is, the present invention provides a method in which a high k dielectric material is formed on an unpinned, i.e. passivated, surface of a III-V compound semiconductor material. In accordance with the method of the present invention, the surface of the III-V compound semiconductor includes substantially no oxide or other contaminants that would otherwise cause a large interface state density in the structure.

In accordance with the present invention, the method begins by first subjecting a III-V compound semiconductor material to a cleaning step that is capable of removing any native oxides such as, $Ga_2O_3$ or $As_2O_5$, from the surface of the III-V compound semiconductor material. This step provides a treated surface that typically remains unpinned. The preclean may be performed by a desorption process or, preferably, by a H plasma process. A semiconducting layer (either amorphous or crystalline) is formed in-situ on the treated surface of the III-V compound semiconductor material. This step, together with the previous precleaning step, provides a structure in which the surface of the III-V compound is passivated. Preferably, the semiconducting layer comprises Si, with amorphous Si being even more highly preferred. At this point of the present invention, the semiconducting layer can optionally be subjected to a nitridation, oxidation or oxynitridation process. That is, the semiconducting layer is optionally converted, completely or partially, into a layer or surface region that is comprised of $AO_xN_y$ wherein A is a semiconducting material, preferably Si, x is from 0 to 1 and y is from 0 to 1; note x and y can not both be zero at the same time. In accordance with the present invention, an in-situ or ex-situ oxidation, nitridation or oxynitridation process can be used. Next, a dielectric material (or multilayers thereof) that has a dielectric constant that is greater than silicon dioxide is formed on either the semiconducting layer, or the $AO_xN_y$ layer.

In general terms, the method of present invention comprises:
removing native oxides from a III-V compound semiconductor material to provide a treated surface;
forming a semiconducting layer in-situ on said treated surface of said III-V compound semiconductor material; and
forming a dielectric material having a dielectric constant that is greater than silicon dioxide on said semiconducting layer.

In one embodiment of the present invention, the method of present invention comprises:
removing native oxides from a III-V compound semiconductor material to provide a treated surface;
forming a semiconducting layer in-situ on said treated surface of said III-V compound semiconductor material;
converting at least an upper surface region of said semiconducting layer to a region comprised of $AO_xN_y$, wherein A is a semiconducting material, x is from 0 to 1, y is from 0 to 1 and x and y are not both 0; and
forming a dielectric material having a dielectric constant that is greater than silicon dioxide on the upper surface region of said semiconducting layer.

In accordance with the present invention, the converting step may include a complete or partial oxidation, nitridation or oxynitridation process. When complete conversion is achieved, the semiconductor layer is modified to comprise a $AO_xN_y$ layer, wherein A, x and y are as defined above. In a preferred embodiment, the semiconducting layer is Si which is modified to a $SiO_xN_y$ layer. In this particular embodiment, the high k dielectric material is formed on a completely modified semiconducting, e.g., $SiO_xN_y$, layer. When partial conversion is achieved, an upper surface region of the originally formed semiconducting layer is modified to include a $AO_xN_y$ surface layer that is located above the remaining semiconducting layer. In this particular embodiment, the dielectric material is formed on the converted upper surface region of the semiconducting layer.

In a highly preferred embodiment of the present invention, the method includes the steps of:
subjecting a GaAs compound semiconductor material to a H preclean, said H preclean removes native oxides from a surface of said GaAs compound semiconductor material;
forming an amorphous Si layer in-situ on said surface of said GaAs compound semiconductor material;
subjecting said Si layer to a nitridation process to form a silicon nitride layer; and forming a Hf-based dielectric on said silicon nitride layer.

The methods of the present invention described above have has several advantages. First the semiconducting, e.g., Si, layer is excellent at passivating a surface of a III-V compound semiconductor material, particularly a GaAs surface. Secondly, by depositing the semiconducting layer using a high-quality technique such as MBE, the surface can be cleaned (either by desorbing the oxygen at high temperatures, or using a H-plasma preclean), to create a virtually oxygen-free interface. The semiconducting layer thickness can be controlled to high precision as well, and thus be made very thin. If the semiconducting layer is nitridated, in situ, a nitrogen plasma could be used to then convert the semiconducting layer to a semiconducting nitride. Nitride, instead of oxide, formation has the advantage that over nitridation will not cause problems, as generally, nitridation of the GaAs surface does not degrade the electrical characteristics. Over oxidation, on the other hand, can severely degrade the electrical characteristics. Once the nitride is formed, the surface is stable against oxidation, and could be removed and exposed to air, for subsequent high k deposition. A semiconducting nitride also has the advantage of allowing the subsequent HfO$_2$ that is deposited to nucleate amorphous as opposed to polycrystalline, which can improve the electrical properties. The HfO$_2$ could be deposited in situ as well, which would have the advantage that the entire gate stack could be deposited in a single vacuum step. The inventive process has the additional advantage that it does not require a high-temperature step, as the H-preclean, semiconducting layer deposition, optional nitridation, oxidation or oxynitridation and high k deposition all could be performed at a temperature of less than 300° C., which would avoid any contamination or surface degradation problems associated with sublimation of one of the elements of the III-V compound semiconductor material.

In addition to the general method and other embodiments thereof described above, the present invention also relates to a semiconductor structure which includes a dielectric material located on a passivated surface of a III-V compound semiconductor material. In accordance with this aspect of the present invention, the inventive structure generally includes:

a III-V compound semiconductor material having a surface that is essentially free of oxides;

a semiconducting layer located on said surface, wherein an interface is present between the III-V compound semiconductor material and the semiconducting layer that has an interface state density of about $10^{12}$ cm$^{-2}$ eV$^{-1}$ or less; and a dielectric material having a dielectric constant greater than that of silicon dioxide located on said semiconducting layer.

In some embodiments, the semiconducting layer includes at least a surface region of AO$_x$N$_y$, where A, x and y are as defined above. In such an embodiment, the dielectric material is located on said surface region of AO$_x$N$_y$.

In yet another embodiment of the present invention, the semiconducting layer of the inventive semiconductor structure is replaced by a AO$_x$N$_y$ layer and the dielectric material is located on that replacement layer.

In a highly preferred embodiment, the semiconductor structure comprises:

a GaAs compound semiconductor material having a surface that is essentially free of oxides;

a silicon nitride layer located on said surface, wherein an interface is present between GaAs and the silicon nitride layer that has an interface state density of about $10^{12}$ cm$^{-2}$ eV$^{-1}$ or less; and a Hf-based dielectric material located on said silicon nitride layer.

In addition to the above, the applicants have determined that the presence of the semiconducting layer acts as a robust cap during the activation of implanted source/drain regions. There is no measurable surface erosion observed in the inventive capped structure even after annealing at temperatures of greater than 800° C. This cap is far superior to conventional caps of SiN$_x$ or SiO$_x$ where measurable surface erosion occurs after annealing at 800° C. or greater. Accordingly, the present invention provides a method of enhancing the activation of implanted dopants within a III/V compound semiconductor material that includes:

providing a semiconducting cap layer atop a III/V compound semiconductor that has a surface that is essentially free of oxides, said III/V compound semiconductor including n-type dopants and/or p-type dopants; and annealing (typically at 800° C. or greater) the dopants to provide at least one activated dopant region in said III/V compound semiconductor.

In this particular embodiment of the present invention, the n-type dopants for III/V materials include Si, Ge, an element from Group VIA of the Periodic Table of Elements or any combination thereof, while the p-type dopants include C, an element from Group IIA of the Periodic Table of Elements or any combination thereof. A conventional ion implantation process, gas phase doping or plasma immersion process can be used to introduce the dopants into the III/V compound semiconductor material and the annealing step is performed utilizing conventional conditions that are well-known in the art.

It should be noted that the term "III-V compound semiconductor material" is used throughout this application to include a semiconductor material that includes at least one element or a mixture of elements from Group IIIA of the Periodic Table of Elements and at least one element or a mixture of elements from Group VA of the Periodic Table of Elements. The III-V compound semiconductor material may be a single layered material or a multilayered material including different III-V compound semiconductors stacked upon each other can be used. In the multilayered embodiment, an upper layer of a III-V compound semiconductor is located on a lower layer of a different III-V compound material, wherein the upper layer has a wider-band gap than that of the lower layer, is used. A III-V layer may also be grown on a IVA elemental semiconductor, e.g., GaP on Si or GaA on Ge or vice a versa.

DETAILED DESCRIPTION OF THE INVENTION

The present invention, which provides a high k gate stack on a III-V compound semiconductor material as well as a method of fabricating the same, will now be described in greater detail by referring to the following discussion and drawings that accompany the present application. It is noted that the drawings of the present application are provided for illustrative proposes and, as such, they are not drawn to scale.

Reference is first made to FIGS. 1A-1D, which are pictorial representations (through cross sectional views) depicting one embodiment of the present invention. In this particular embodiment, a semiconducting layer 14 is first formed on a treated surface 11 of a III-V compound semiconductor material 10 and thereafter a dielectric material 16 having a dielectric constant of greater than that of silicon dioxide is formed on the semiconducting layer 14.

Figure 1A:
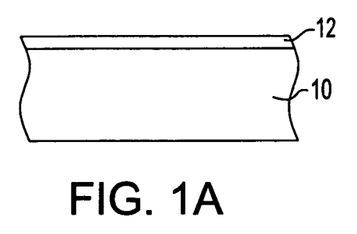
FIGS. 1A-1D are pictorial representations (through cross sectional views) depicting one embodiment of the present invention.

Reference is first made to FIG. 1A which illustrates an initial III-V compound semiconductor material 10 that can be used in the present invention. As shown, the initial III-V compound semiconductor material 10 has region 12 that includes native oxides, atomic Ga or As species and other contaminants such as, for example, C-containing compounds therein. In accordance with the present invention, the initial III-V compound semiconductor material 10 used is a semiconductor material that includes at least one element or a mixture of elements from Group IIIA of the Periodic Table of Elements and at least one element or a mixture of elements from Group VA of the Periodic Table of Elements. Illustrative examples of III-V compound semiconductors that can be used as material 10 include, but are not limited to: GaAs, InP, InAs, GaP, InSb, GaSb, GaN, InGaAs, and InAsSb. Preferably the III-V compound semiconductor is one of GaAs optionally including In, or one of InSb optionally including As.

The III-V compound semiconductor material 10 may be a single layered material (as shown) or a multilayered material (see FIG. 2A, for example) including different III-V compound semiconductors stacked upon each other. In the multilayered embodiment, an upper layer of a III-V compound semiconductor is located on a lower layer of a different III-V compound material, wherein the upper layer has a wider-band gap than the lower layer. Some examples of such materials include, but are not limited to: an AlGaAs layer atop a InGaAs layer, a InGaP layer located atop a InGaAs layer, InAlAs layer atop a InGaAs layer, or a AlSb layer atop an InAsSb layer. A III-V layer may also be grown on a IVA elemental semiconductor, e.g., GaP on Si or GaA on Ge or vice a versa.

The region 12 of native oxides and other contaminates typically includes at least an oxide of one of the elements of the initial III-V compound semiconductor material. For example, if the initial III-V compound semiconductor material 10 is GaAs, region 12 would include an oxide of Ga and/or an oxide of As. The initial III-V compound semiconductor material 10 includes an untreated surface at this point of the present invention which, if used without cleaning and passivated, would result in a structure that is pinned and has a high interface state density (on the order of about $10^{13}$ cm$^{-2}$ eV$^{-1}$ or greater).

Figure 1B:
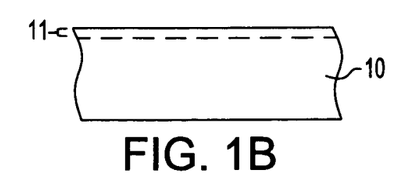

FIG. 1B shows the III-V compound semiconductor material 10 of FIG. 1A after the region 12 of native oxides and other contaminates is removed from the material forming a treated surface 11. The treated surface 11 which contains essentially no oxides and other contaminates is formed by utilizing a desorption process or by utilizing a H plasma precleaning process. By "essentially free of oxide" it is meant that the oxide content is about $10^{-2}$ of a monolayer or less.

When a desorption process is used to remove region 12 forming the treated surface 11, the desorption is carried out in vacuum or an inert ambient such as, for example, N$_2$, He, Ar or a mixture thereof, at a temperature of about 600° C. or greater. The desorption is typically performed in the presence of a partial pressure of As wherein a partial pressure equivalent to an incident flux of about $10^{14}$ As molecules cm$^{-2}$ or higher is established.

Although desorption can be used, it is preferred in the present invention that the region 12 is removed from the III-V compound semiconductor material 10 utilizing a H plasma process. The H plasma process includes providing a plasma of hydrogen, H, using a hydrogen source such as, for example, molecular or, more preferably, atomic hydrogen. The hydrogen plasma is a neutral, highly ionized hydrogen gas that consisting of neutral atoms or molecules, positive ions and free electrons. Ionization of the hydrogen source is typically carried out in a reactor chamber in which the ionization process is achieved by subjecting the source to strong DC or AC electromagnetic fields. Alternatively, the ionization of the hydrogen source is performed by bombarding the gate atoms with an appropriate electron source.

In accordance with a preferred embodiment of the present invention, the hydrogen plasma process used to provide the treated surface 11 is performed at a temperature of about 300° C. or less.

As stated above, this step of the present invention removes the region 12 including at least the native oxides of the III-V compound semiconductor material from the initial material providing a treated surface 11 such as shown, for example, in FIG. 1B. The interface formed at the treated surface located between the III-V compound semiconductor 10 and the semiconductor layer (to be subsequently formed) has a low interface state density of on the order of about $10^{12}$ cm$^{-2}$ eV$^{-1}$ or less.

The thickness of the treated surface 11 may vary depending on the technique used in forming the same and the exact conditions employed. Typically, the treated surface 11 has a thickness that is about a few monolayers or greater.

Figure 1C:
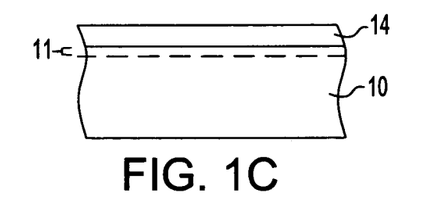

After forming the treated surface 11, a semiconducting layer 14 is formed thereon providing the structure shown, for example, in FIG. 1C. The semiconducting layer 14 may be crystalline or, more preferably, amorphous. The term "semiconducting layer" denotes a layer including Si, Ge alloys, SiGe, SiC, SiGeC and the like. Preferably, the semiconducting layer 14 is comprised of Si. In accordance with the present invention, the semiconducting layer 14 is formed in-situ in the same reactor chamber as used in providing the treated surface 11. This step provides a semiconducting layer that passivates the previously cleaned III-V compound semiconductor material. The semiconducting layer 14 is formed by molecular beam epitaxy (MBE), chemical vapor deposition (CD), and other like deposition processes. Preferably, MBE is used in forming the semiconducting layer 14.

The thickness of the semiconducting layer 14 may vary depending on the technique used in forming the same. Typically, the semiconducting layer 14 has a thickness from about 0.5 to about 5 nm, with a thickness from about 0.5 to about 2 nm being even more typical.

In the specific embodiment illustrated, a dielectric material 16 having a dielectric constant of greater than that of silicon dioxide is formed on the surface of the semiconducting layer 14. The dielectric material 16 employed in the present invention comprises any metal oxide or mixed metal oxide that is typically used as a gate dielectric or a capacitor dielectric in semiconductor device manufacturing. Examples of such dielectric materials (which can be referred to as a high k dielectric since they have a dielectric constant of that which is greater than silicon dioxide) include, but are not limited to: Al$_2$O$_3$, AlON, Ta$_2$O$_5$, TiO$_2$, La$_2$O$_3$, SrTiO$_3$, LaAlO$_3$, ZrO$_2$, Y$_2$O$_3$, Gd$_2$O$_3$, MgO, MgNO, Hf-based dielectrics (to be described in greater detail herein below), and combinations including multilayers thereof.

The term 'Hf-based dielectric' is intended herein to include any high k dielectric containing hafnium, Hf. Examples of such Hf-based dielectrics comprise hafnium oxide (HfO$_2$), hafnium silicate (HfSiO$_x$), Hf silicon oxynitride (HfSiON), HfLaO$_x$, HfLaSiO$_x$HfLaSiON$_x$ or multilayers thereof. Typically, the Hf-based dielectric is hafnium oxide or hafnium silicate. Hf-based dielectrics typically have a dielectric constant that is greater than about 10.0.

The physical thickness of the dielectric material 16 may vary, but typically, the dielectric material 16 has a thickness from about 0.2 to about 20 nm, with a thickness from about 0.5 to about 10 nm being more typical. The dielectric material 16 may be formed in-situ or ex-situ utilizing any conventional deposition process including, for example, chemical vapor deposition, PECVD, atomic layer deposition, chemical solution deposition, MOCVD, evaporation and other like deposition processes.

In one embodiment of the present invention, the dielectric material 16 is hafnium oxide that is formed by MOCVD were hafnium-tetrabutoxide (a Hf-precursor) and $O_2$ are used. In such an embodiment, the $O_2$ may be molecular oxygen, or preferably, atomic oxygen is used. The deposition of Hf oxide occurs using a chamber pressure of about 1 Torr or less and a substrate temperature of about 200° C. or greater. In another embodiment of the present invention, the dielectric material 16 is hafnium silicate which is formed by MOCVD using the precursor Hf-tetrabutoxide, $O_2$, and $SiH_4$; (ii) a chamber pressure of about 1 Torr or less; and (iii) a substrate temperature of about 200° C. or greater may also be used.

Reference is now made to FIGS. 2A-2E which illustrates another embodiment of the present invention. In this embodiment of the present invention, a semiconducting layer 14 is first formed on a treated surface 11 of a III-V compound semiconductor material 10 (including top and bottom layers as described above) and thereafter the semiconducting layer 14 is completely or partially converted into a layer 15 including at least a surface region comprised of $AO_xN_y$, wherein A is a semiconducting material, x is 0 to 1, y is 0 to 1 and x and y are both not zero. In the embodiment where complete conversion is achieved, layer 15 is completely comprised of $AO_xN_y$. In embodiments where partially conversion is achieved, the upper surface portion of layer 15 is comprised of $AO_xN_y$ and the remaining portion of layer 15 is comprised of the semiconducting material. FIG. 3 shows such an embodiment, wherein 15A is the remaining semiconducting material of layer 14 and 15B is the $AO_xN_y$ material. Note that in FIG. 3, the remaining semiconducting layer is optional. In either embodiment, the treated surface is passivated with either a $AO_xN_y$ layer or a material stack comprising, from bottom to top, a semiconducting material and a $AO_xN_y$ layer.

Figure 2A:
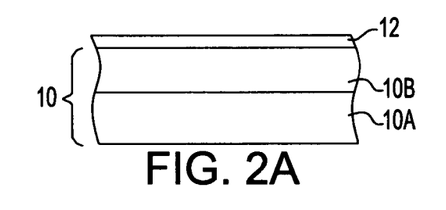
FIGS. 2A-E are pictorial representations (through cross sectional views) depicting another embodiment of the present invention.
Figure 2B:
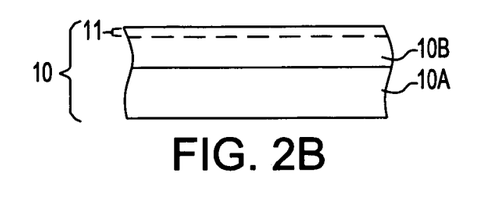
Figure 2C:
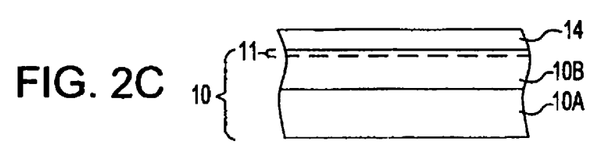
Figure 2D:
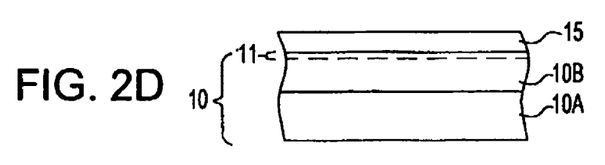

This embodiment shown in FIGS. 2A-2E begins by first providing the structure shown in FIG. 2A which includes a III-V compound semiconductor material 10 having a region 12 of native oxides and other contaminants therein. The semiconductor material 10 and the region 12 are the same as described above for FIG. 1A. It is noted that in these drawings, the semiconductor material 10 is shown as including a top III-V compound semiconductor layer 10B that has a wider band gap than that of the lower III-V compound semiconductor layer 10A. FIG. 2B illustrates the structure that is formed after removing the region 12 from the structure and forming the treated surface 11 therein. This step of the illustrated embodiment is the same as that described above for FIG. 1B. Next, and as is shown in FIG. 2C, a semiconducting layer 14 (as described above) is formed on the treated surface 11.

After forming the semiconducting layer 14, layer 14 is converted completely or partially converted into a layer 15 that is comprised of at least a surface region including $AO_xN_y$, wherein A is a semiconducting material, x is 0 to 1, y is 0 to 1 and x and y are both not zero. The resultant structure including layer 15 is shown, for example, in FIG. 2D. In accordance with this embodiment of the present invention, the semiconducting layer 14 is subjected to a nitridation, oxidation or oxynitridation process which may be performed in-situ or ex-situ utilizing conventional conditions that are well known in the art. Plasma and thermal techniques are both contemplated herein. In the case of semiconducting layer 14 being Si, a $SiN_y$ layer can be formed by exposing the semiconducting layer 14 to atomic nitrogen, with a partial pressure typically in the range of $10^{-6}$ to $10^{-4}$ Torr, at a temperature in the range of about 200° C. or greater, and a $SiO_x$ layer to atomic O, with a partial pressure typically in the range of $10^{-6}$ to $10^{-4}$ Torr at a temperature in the range of about 200° C. or greater, and a $SiO_xN_y$ layer can be formed by utilizing a sequential or concurrent combination of these conditions. It is noted that other conditions can be used besides those mentioned herein for this step of the present invention. In accordance with the present invention, it is preferred that this step of the present invention by performed in-situ. The conditions and duration of the converting will determine whether the semiconducting layer 14 is completely (typically characterized by longer processing times) or partially modified (typically characterized by shorter processing times).

When complete conversion is achieved, the semiconducting layer 14 is modified to a $AO_xN_y$ layer, wherein A, x and y are as defined above. When partial conversion is achieved, an upper surface region of the originally formed semiconducting layer 14 is modified to include a $AO_xN_y$ surface layer that is located above the remaining semiconducting material. In this particular embodiment, the dielectric material is formed on the converted upper surface region. In such an embodiment, the upper surface region including the $AO_xN_y$ surface layer has a thickness from about 0.5 to about 8 nm, with a thickness of about 0.5 to about 2 nm being even more typical.

Figure 2E:
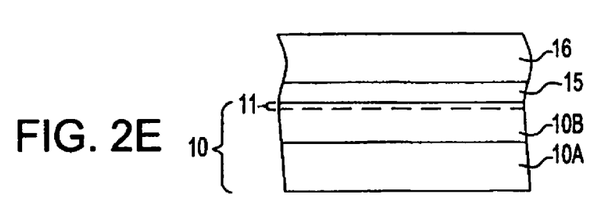
Figure 3:
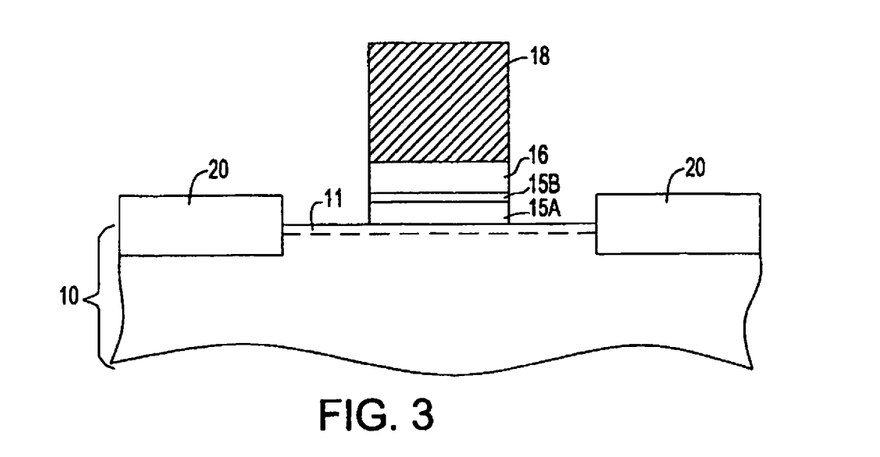
FIG. 3 is a pictorial representation (through a cross sectional view) depicting a FET that includes the inventive semiconductor structure.

FIG. 2E illustrates the structure after a dielectric material 16 (as described above) is formed on layer 15. Notwithstanding partial or complete conversion of layer 15, the dielectric material 16 is formed on a surface that is comprised of $AO_xN_y$.

Figure 1D:
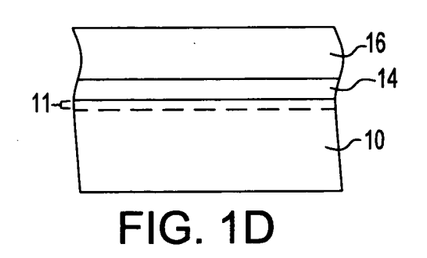

The material stacks shown in FIG. 1D or 2E can be used in fabricating a metal oxide semiconductor capacitor (MOSCAP) and/or MOSFET utilizing conventional processes that are well known in the art. One example of a MOSFET is shown in FIG. 3; in this drawings reference numeral 10 denotes the III-V compound semiconductor, reference numeral 11 denotes the treated surface, reference numeral 15B denotes the $AO_xN_y$ layer, reference numeral 15A denotes the remaining semiconductor material of the semiconductor layer, reference numeral 16 denotes the high k dielectric material, reference numeral 18 denotes the gate electrode, and reference numeral 20 denotes the source/drain diffusion regions. In each case, an electrode or an electrode stack is formed on the material stacks shown in FIG. 1D or 2E and thereafter there material layers are patterned by lithography and etching.

The electrode or electrode stack, which comprises at least one conductive material, is formed utilizing a known deposition process such as, for example, physical vapor deposition, CVD or evaporation. The conductive material used as the electrode includes, but is not limited to: Si-containing materials such as Si or a SiGe alloy layer in either single crystal, polycrystalline or amorphous form. The conductive material may also be a conductive metal or a conductive metal alloy. Combinations of the aforementioned conductive materials are also contemplated herein. Si-containing materials are preferred, with polySi being most preferred. In addition to aforementioned conductive materials, the present invention also contemplates instances wherein the conductor is fully silicided or a stack including a combination of a silicide and Si or SiGe. The silicide is made using a conventional silicidation process well known to those skilled in the art. Fully silicided layers can be formed using a conventional replacement gate process; the details of which are not critical to the practice of the present invention. The blanket layer of conductive material may be doped or undoped. If doped, an in-situ doping deposition process may be employed in forming the same. Alternatively, a doped conductive material can be formed by deposition, ion implantation and annealing. The ion implantation and annealing can occur prior to or after a subsequent etching step that patterns the material stack. The doping of the conductive material will shift the workfunction of the electrode formed. The thickness, i.e., height, of the electrode deposited at this point of the present invention may vary depending on the deposition process employed. Typically, the electrode has a vertical thickness from about 20 to about 180 nm, with a thickness from about 40 to about 150 nm being more typical.

The MOSCAP formation typically includes forming a thermal, chemical or deposited sacrificial oxide (not shown) on the surface of the III-V compound semiconductor material. Using lithography, the active areas of the capacitor structure are opened in the field oxide by etching. Following the removal of the oxide, the material stack as shown in FIG. 1D or 2E is formed as described above. Specifically, the material stack is provided, patterned by lithography and etching, and then a gate electrode including dopants is formed on the dielectric stack. In the case of a poly-silicon gate electrode, the dopants are typically P or As, and can be incorporated by implantation with a typical dose in the range of $1 \times 10^{15}$ ions/cm$^2$ to $5 \times 10^{15}$ ions/cm$^2$, or in situ doping during poly-silicon deposition using dopant precursor species such as $AsH_3$ or $PH_3$. The dopants are activated using an activation anneal that is performed at 900° C. to 1000° C. for about 5 seconds. The MOS cap could also incorporate a metal or metal-alloy stack alone or in combination with a polysilicon gate electrode. In some cases, an anneal step can be performed before or after the deposition of the gate electrode. Said anneal step is typically performed between 500° to 800° C., and is typically performed in a nitrogen ambient.

The MOSFET formation includes first forming isolation regions, such as trench isolation regions, within the III-V compound semiconductor material described above. A sacrificial oxide layer can be formed atop the III-V compound semiconductor material to form the isolation regions. Similar to the MOSCAP and after removing the sacrificial oxide, a material stack as described above is formed. Next, a gate electrode is formed and the material stack is then patterned. Following patterning of the material stack, at least one spacer is typically, but not always, formed on exposed sidewalls of each patterned material stack. The at least one spacer is comprised of an insulator such as an oxide, nitride, oxynitride and/or any combination thereof. The at least one spacer is formed by deposition and etching.

The width of the at least one spacer must be sufficiently wide such that the source and drain silicide contacts (to be subsequently formed) do not encroach underneath the edges of the patterned material stack. Typically, the source/drain silicide does not encroach underneath the edges of the patterned material stack when the at least one spacer has a width, as measured at the bottom, from about 20 to about 80 nm.

The patterned material stack can also be passivated at this point of the present invention by subjecting the same to a thermal oxidation, nitridation or oxynitridation process. The passivation step forms a thin layer of passivating material about the material stack. This step may be used instead or in conjunction with the previous step of spacer formation. When used with the spacer formation step, spacer formation occurs after the material stack passivation process.

Source/drain diffusion regions are then formed into the substrate. The source/drain diffusion regions are formed utilizing ion implantation and an annealing step. Typically, a raised source/drain process is used. The annealing step serves to activate the dopants that were implanted by the previous implant step. The conditions for the ion implantation and annealing are well known to those skilled in the art. The source/drain diffusion regions may also include extension implant regions which are formed prior to source/drain implantation using a conventional extension implant. The extension implant may be followed by an activation anneal, or alternatively the dopants implanted during the extension implant and the source/drain implant can be activated using the same activation anneal cycle. Halo implants are also contemplated herein.

In some cases, an annealing step as described above can be performed. Further CMOS processing such as formation of silicided contacts (source/drain and gate) as well as formation of BEOL (back-end-of-the-line) interconnect levels with metal interconnects can be formed utilizing processing steps that are well known to those skilled in the art.

The following example is provided for illustrative purposes and thus it should not be construed to limit the scope of the present application in any way.

Example

In this example, a MOSCAP was prepared utilizing a semiconductor structure in accordance with the present invention. The inventive structure included, from bottom to top, an atomic-H passivated GaAs substrate, an amorphous Si layer, $SiO_x$ and $HfO_2$. The structure was formed utilizing the inventive processing details described above. After formation, a gate electrode was formed thereon and the structure was annealed at 700° C., 1 min., in nitrogen.

Figure 4A:
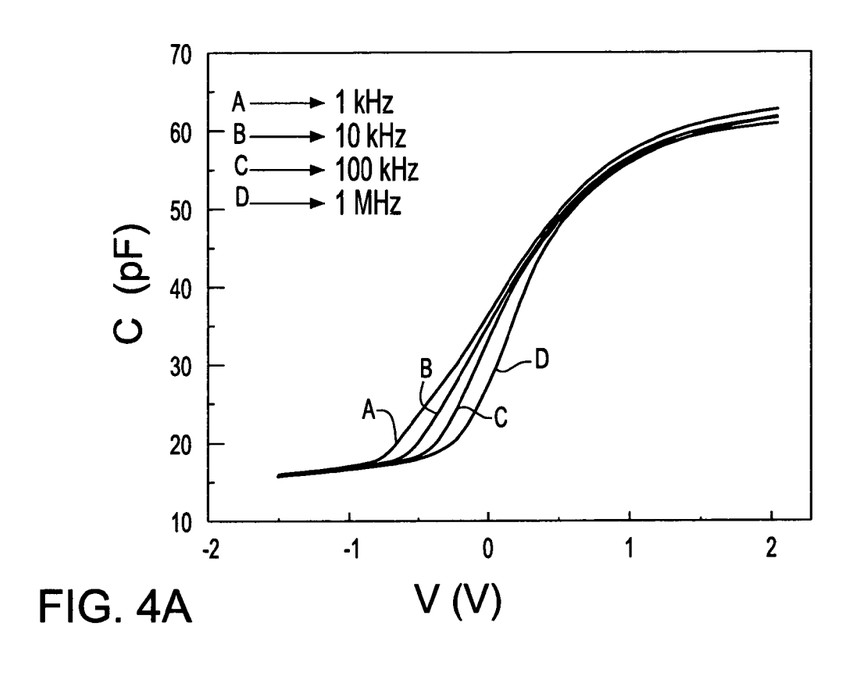
FIG. 4A is a graph showing the C-V characteristics of a MOS capacitor comprising GaAs/amorphous Si/SiO$_x$/HfO$_2$, after annealing at 700° C. for 1 minute in a nitrogen ambient.
Figure 4B:
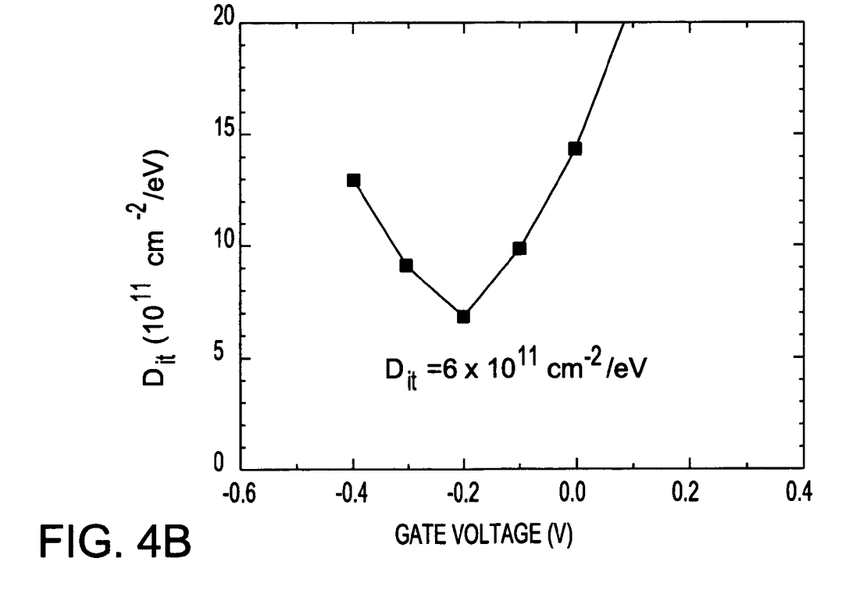
FIG. 4B is graph showing the interface state density as a function of gate voltage of the MOS capacitor mentioned in FIG. 4A.

FIG. 4A shows the CV curves of such a MOSCAP at 1 kHz, 10 kHz, 100 kHz and 1 MHz. Specifically, the CV curves have very low frequency dispersion, which is indicative of low interface state density. FIG. 4B shows the $D_{it}$ extracted as a function of gate voltage of the same MOSCAP as in FIG. 4A using the frequency-dependent method well known in the art. The results show a minimum $D_{it}$ value of $6 \times 10^{11}$ cm$^{-2}$/eV, which is over an order of magnitude lower than typically obtained on MOSCAPs with $HfO_2$ directly on an unpassivated GaAs.

While the present invention has been particularly shown and described with respect to preferred embodiments thereof, it will be understood by those skilled in the art that the foregoing and other changes in forms and details may be made without departing from the spirit and scope of the present invention. It is therefore intended that the present invention not be limited to the exact forms and details described and illustrated, but fall within the scope of the appended claims.

What is claimed is:
1. A semiconductor structure comprising:
a III-V compound semiconductor material having a topmost surface that is essentially free of native oxides;
a material stack located on said III-V compound semiconductor material; and
a source/drain diffusion region located adjacent a pair of opposing sides of, and spaced apart from, said material stack, wherein each source/drain diffusion region has a topmost surface that is located above said topmost surface of said III-V compound semiconductor material and a bottommost surface that contacts a portion of said III-V compound semiconductor material that is located beneath said topmost surface of III-V compound semiconductor material, wherein said material stack comprises:
a base semiconductor layer comprising a first semiconductor material located directly on said topmost surface of said III-V compound semiconductor material, wherein the first semiconductor material includes at least one of Ge alloys, SiGe, SiC and SiGeC;
a layer of $AO_xN_y$ located on an upper portion of said base semiconductor layer, wherein A is said first semiconductor material, x is from 0 to 1, y is from 0 to 1, with the proviso that when x is 0, y is not 0 or when y is 0, x is not 0, and wherein an interface is present between said topmost surface of said III-V compound semiconductor material and a bottommost surface of said base semiconductor layer that has an interface state density of about $10^{12}$ cm$^{-2}$ eV$^{-1}$ or less, and
a dielectric material located directly on said layer of $AO_xN_y$, said dielectric material having a dielectric constant that is greater than silicon dioxide and comprising a metal oxide or a mixed metal oxide.

2. The semiconductor structure of claim 1, wherein said base semiconductor layer is amorphous.

3. The semiconductor structure of claim 1, wherein said dielectric material is a Hf-based dielectric.

4. The semiconductor structure of claim 3, wherein said dielectric material is a single layer that is in directed contact with said layer of $AO_xN_y$.

5. The semiconductor structure of claim 1, further comprising an electrode or electrode stack on said dielectric material.

6. The semiconductor structure of claim 1, wherein said dielectric material is a component of at least one field effect transistor.

* * * * *